US010559942B2

(12) United States Patent
Hagita et al.

(10) Patent No.: US 10,559,942 B2
(45) Date of Patent: Feb. 11, 2020

(54) LASER DEVICE AND INTERNAL COMBUSTION ENGINE

(71) Applicants: Kentaroh Hagita, Miyagi (JP); Naoto Jikutani, Miyagi (JP); Masaki Hiroi, Miyagi (JP)

(72) Inventors: Kentaroh Hagita, Miyagi (JP); Naoto Jikutani, Miyagi (JP); Masaki Hiroi, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 38 days.

(21) Appl. No.: 15/919,254

(22) Filed: Mar. 13, 2018

(65) Prior Publication Data

US 2018/0269656 A1    Sep. 20, 2018

(30) Foreign Application Priority Data

Mar. 16, 2017 (JP) ................................ 2017-051228
Jan. 17, 2018 (JP) ................................ 2018-005674

(51) Int. Cl.
*F02P 23/00* (2006.01)
*H01S 5/183* (2006.01)
*F02P 23/04* (2006.01)
*G02B 19/00* (2006.01)
*H01S 5/42* (2006.01)
*H01S 3/094* (2006.01)
(Continued)

(52) U.S. Cl.
CPC .......... *H01S 5/18313* (2013.01); *F02P 23/04* (2013.01); *G02B 19/0057* (2013.01);
(Continued)

(58) Field of Classification Search
CPC ... F02P 23/04; F02B 2075/125; F02B 23/104; F02D 35/022; F02D 35/023
(Continued)

(56) References Cited

U.S. PATENT DOCUMENTS

2004/0028354 A1* 2/2004 Watanabe ............ G02B 6/4208
                                                                385/94
2006/0173242 A1* 8/2006 Navok ................. A61B 1/0011
                                                                600/133
(Continued)

FOREIGN PATENT DOCUMENTS

DE    10 2016 101 266 A1    8/2016
JP            6-249123 A        9/1994
(Continued)

OTHER PUBLICATIONS

Extended European Search Report dated Aug. 3, 2018 in Patent Application No. 18160295.4, 9 pages.

*Primary Examiner* — John Kwon
(74) *Attorney, Agent, or Firm* — Oblon, McClelland, Maier & Neustadt, L.L.P.

(57) ABSTRACT

A laser device and an internal combustion engine. The laser device includes a light source configured to emit light, an optical system configured to concentrate the light emitted from the light source, a housing configured to accommodate the optical system, and a window disposed to the housing, to which the light passed through the optical system is incident. The window includes an optical window through which the light exited from the optical system passes, an optical window holding member configured to hold the optical window, a joint configured to join the optical window to the optical window holding member, and a protective layer disposed to a face of the joint. The internal combustion engine includes the laser device according to claim, and a combustion chamber configured to burn fuel to produce inflammable gas. In the internal combustion engine, the fuel is ignited by the laser device.

7 Claims, 4 Drawing Sheets

(51) Int. Cl.
*H01S 3/0941* (2006.01)
*G03G 15/04* (2006.01)

(52) U.S. Cl.
CPC .... *H01S 3/09415* (2013.01); *H01S 3/094053* (2013.01); *H01S 5/18377* (2013.01); *H01S 5/423* (2013.01); *G03G 15/04* (2013.01)

(58) Field of Classification Search
USPC .......................................... 123/143 R, 169 R
See application file for complete search history.

(56) References Cited

U.S. PATENT DOCUMENTS

| | | | |
|---|---|---|---|
| 2006/0243238 A1 | 11/2006 | Anezaki et al. | |
| 2009/0159032 A1 | 6/2009 | Gruber | |
| 2010/0263615 A1 | 10/2010 | Weinrotter et al. | |
| 2013/0112164 A1 | 5/2013 | Morishima et al. | |
| 2013/0340696 A1 | 12/2013 | Woerner et al. | |
| 2016/0109357 A1* | 4/2016 | Lorbeer | G02B 21/34 |
| | | | 250/576 |
| 2016/0276809 A1 | 9/2016 | Okura et al. | |
| 2016/0344163 A9 | 11/2016 | Engelhardt et al. | |
| 2017/0023546 A1* | 1/2017 | Holmes | G01N 33/491 |
| 2017/0168412 A1* | 6/2017 | Harada | H01S 5/18311 |
| 2017/0179667 A1 | 6/2017 | Okura et al. | |
| 2018/0069559 A1* | 3/2018 | Maki | H01S 5/06804 |

FOREIGN PATENT DOCUMENTS

| | | |
|---|---|---|
| JP | 3481643 B2 | 12/2003 |
| JP | 2013-096392 | 5/2013 |
| JP | 2016-142193 | 8/2016 |

* cited by examiner

LASER DEVICE AND INTERNAL COMBUSTION ENGINE

CROSS-REFERENCE TO RELATED APPLICATIONS

This patent application is based on and claims priority pursuant to 35 U.S.C. § 119(a) to Japanese Patent Application Nos. 2017-051228 and 2018-005674, filed on Mar. 16, 2017, and Jan. 17, 2018, respectively, in the Japan Patent Office, the entire disclosures of which are hereby incorporated by reference herein.

BACKGROUND

Technical Field

Embodiments of the present disclosure relate to a laser device and an internal combustion engine.

Background Art

Laser devices that adopt a semiconductor laser as a pump source are expected to be applied to various kinds of fields including, for example, ignition systems, laser beam machines, and medical equipment. In particular, methods have been studied in which such laser devices are used as an ignition system in internal combustion engines of cars or the like.

In such an ignition system, a Q-switched laser resonator is irradiated with the laser beams (pump light) that are emitted from a semiconductor laser to emit pulsed laser beams of high energy density. The emitted pulsed laser beams are concentrated into the mixture of gases inside the combustion chamber through a condenser lens inside the cylinder head and a transparent window (optical window) of the combustion chamber. As a result, plasma is generated inside the combustion chamber, and the fuel that is injected into the combustion chamber is ignited.

The optical window is exposed to the combustion chamber. In order for the optical window to withstand the high temperature and high pressure caused by combustion in the combustion chamber, the optical window is fixed to an optical window holding member provided for the housing, using a brazing material.

SUMMARY

Embodiments of the present disclosure described herein provide a laser device and an internal combustion engine. The laser device includes a light source configured to emit light, an optical system configured to concentrate the light emitted from the light source, a housing configured to accommodate the optical system, and a window disposed to the housing, to which the light passed through the optical system is incident. The window includes an optical window through which the light exited from the optical system passes, an optical window holding member configured to hold the optical window, a joint configured to join the optical window to the optical window holding member, and a protective layer disposed to a face of the joint. The internal combustion engine includes the laser device according to claim, and a combustion chamber configured to burn fuel to produce inflammable gas. In the internal combustion engine, the fuel is ignited by the laser device.

BRIEF DESCRIPTION OF THE DRAWINGS

A more complete appreciation of exemplary embodiments and the many attendant advantages thereof will be readily obtained as the same becomes better understood by reference to the following detailed description when considered in connection with the accompanying drawings.

Figure 1:
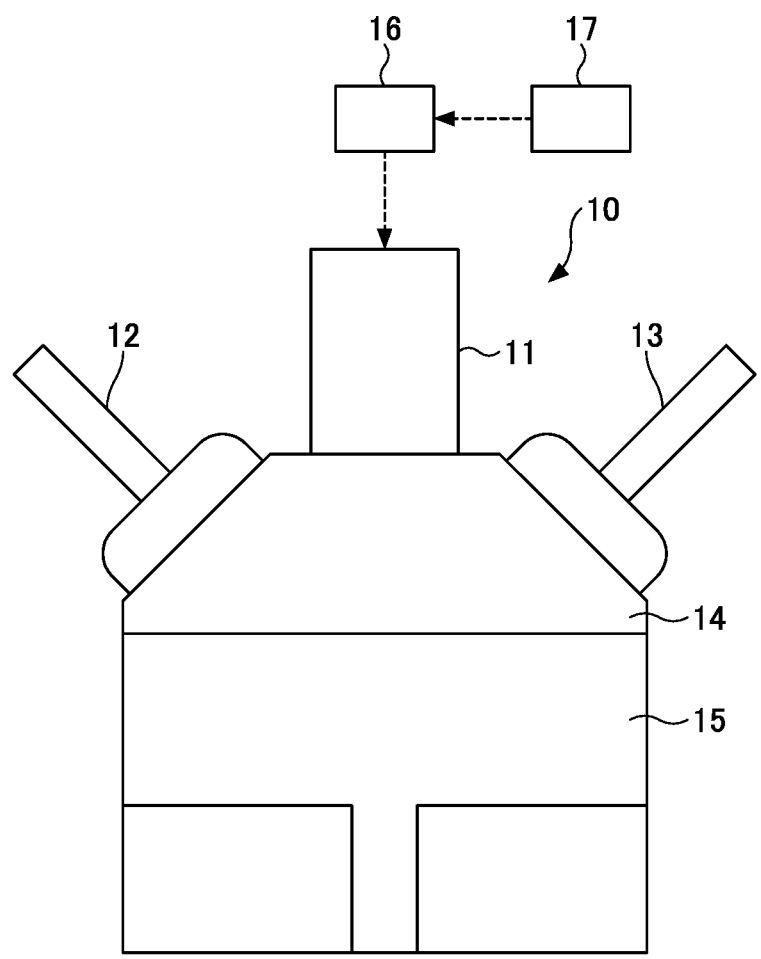
FIG. 1 is a schematic diagram of elements of an internal combustion engine for which a laser device according to an embodiment of the present disclosure is provided.

The accompanying drawings are intended to depict exemplary embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that have the same structure, operate in a similar manner, and achieve a similar result.

Some embodiments of the present disclosure are described below in detail with reference to the accompanying drawings.

An embodiment in which a laser device according to an embodiment of the present disclosure is used for as an internal combustion engine is described with reference to the drawings. In the present embodiment, an engine is used as the internal combustion engine.

<Internal Combustion Engine>

FIG. 1 is a schematic diagram of elements of an internal combustion engine for which a laser device according to an embodiment the present disclosure is provided.

As illustrated in FIG. 1, an engine 10 includes, for example, a laser device 11, a fuel injector 12, an exhauster 13, a combustion chamber 14, and a piston 15.

The operation of the engine 10 is briefly described. The fuel injector 12 injects the inflammable fuel-air mixture into the combustion chamber 14 (aspiration). Then, the piston 15 moves upward, the inflammable fuel-air mixture is compressed (compression). The laser device 11 concentrates the laser beams into the compressed mixture of gases in the combustion chamber 14, in order to generate plasma. Then, the fuel in the mixture of gases is ignited by the generated plasma (ignition). As the mixture of gases burns (explodes) due to the ignition, the inflammable gas expands inside the combustion chamber 14. As a result, the piston 15 moves downward (combustion). After that, the exhauster 13 exhausts the inflammable gas to the outside of the combustion chamber 14 (exhaust).

As described above, a series of processes including aspiration, compression, ignition, combustion, and exhaust are repeated in the engine 10. Then, the piston 15 moves upward and downward according to the changes in the volume of the gas in the combustion chamber 14, and kinetic energy is produced. As fuel, for example, natural gas and gasoline are used.

Note that the laser device 11 is electrically connected to a driver 16 that is arranged outside the engine 10, and the driver 16 controls the laser beams emitted from the laser device 11 based on instructions given from an engine controller 17.

<Laser Device>

Next, the laser device 11 is described.

Figure 2:
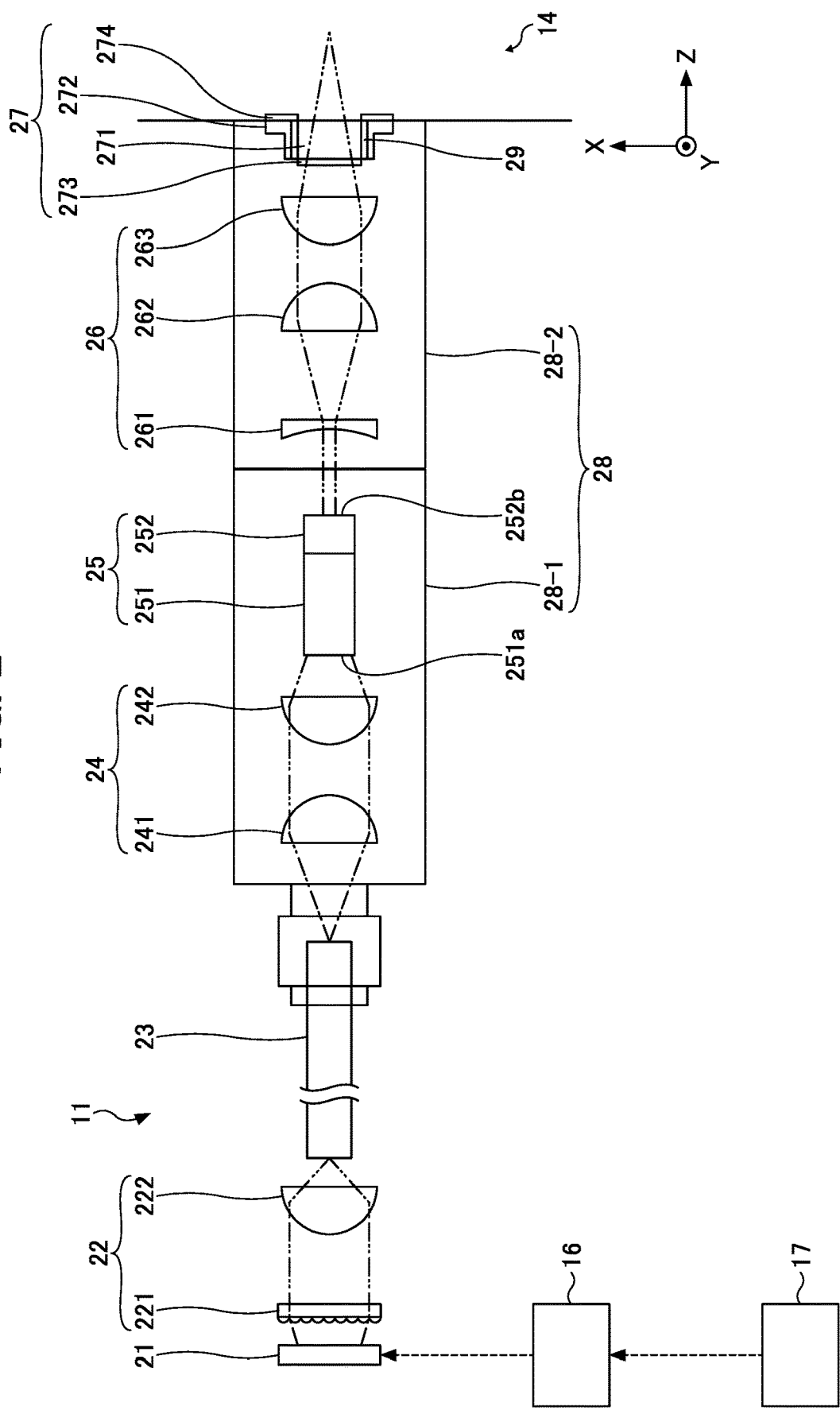
FIG. 2 is a diagram illustrating a configuration of a laser device, according to an embodiment of the present disclosure.

FIG. 2 is a diagram illustrating a configuration of the laser device 11, according to the present embodiment.

As illustrated in FIG. 2, the laser device 11 includes a surface emitting laser (light source) 21, a first condensing optical system 22, an optical fiber (transmission member) 23, a second condensing optical system 24, a laser resonator 25, a third condensing optical system 26, a window 27, and a housing 28. In FIG. 2, the laser beams are indicated by the two-dot chain line. In the XYZ three-dimensional rectangular coordinate system according to the present embodiment, it is assumed that the direction in which the surface emitting laser 21 emits light is in the +Z-direction.

The surface emitting laser 21 is a pump source, and includes a plurality of light-emitting units. Each of the light-emitting units is a vertical cavity-surface emitting laser (VCSEL). When the surface-emitting laser 21 emits laser beams, the multiple light-emitting units emit laser beams at the same time. On the other hand, when the surface-emitting laser 21 does not emit laser beams, the multiple light-emitting units are turned off at the same time. Moreover, the wavelength of the laser beams that are emitted from the surface-emitting laser 21 is, for example, about 808 nanometers (nm).

The surface-emitting laser 21 is electrically connected to the driver 16, and the driver 16 drives the surface-emitting laser 21 based on instructions given from the engine controller 17. Accordingly, the laser beams are emitted from the surface emitting laser 21.

It is to be noted that an end-surface emitting laser is known as a semiconductor laser. However, the wavelength of the laser beams that are emitted from such an end-surface emitting laser tends to fluctuate widely depending on the temperature. The laser device 11 is used under high-temperature environments around the engine 10. For this reason, when an end-surface emitting laser is used as a pump source, a high-precision temperature control unit that maintains the temperature of the end-surface emitting laser at a constant level needs to be provided. This leads to an increase in the cost of manufacturing the laser device 11 and an increase in the size of the laser device 11.

By contrast, changes in the wavelength of the laser beams that are emitted from the surface-emitting laser 21 is about one-tenths of the changes in the wavelength of the laser beams that are emitted from the end-surface emitting laser. The laser device 11 uses the surface-emitting laser 21 as a pump source. Accordingly, a high-precision temperature control unit is not necessary. This leads to a reduction in the cost of manufacturing the laser device 11 and a reduction in the size of the laser device 11. Moreover, the light-emitting area of the surface-emitting laser 21 is arranged inside the semiconductor. Accordingly, the surface-emitting laser 21 can emit laser beams in a stable manner with no concern about the damage at the end surface.

Note also that the surface-emitting laser 21 has very little temperature-driven wavelength displacement in the emitted laser beams. For this reason, the surface-emitting laser 21 is a light source advantageous in increasing the energy density of the laser beams in a Q-switched laser resonator whose characteristics vary widely due to the wavelength displacement. Accordingly, when the surface-emitting laser 21 is used as a pump source, the temperature control of the environment becomes easier.

The first condensing optical system 22 concentrates the laser beams that are emitted from the surface-emitting laser 21 into the core diameter of the optical fiber 23 on the −Z side lateral edge face. The first condensing optical system 22 includes at least one condenser lens. In the present embodiment, the first condensing optical system 22 includes a microlens 221 and a condenser lens system 222.

The microlens 221 is disposed in the optical path of the laser beams emitted from the surface-emitting laser 21. The microlens 221 includes a plurality of lenses that correspond to the multiple light-emitting units of the surface-emitting laser 21. The plurality of lenses of the microlens 221 approximately collimate the laser beams emitted from the corresponding light-emitting units of the surface-emitting laser 21. In other words, the microlens 221 collimates the laser beams emitted from the surface-emitting laser 21.

The distance between the surface-emitting laser 21 and the microlens 221 in the Z-axis direction is determined according to the focal length of the microlens 221.

The condenser lens system 222 concentrates the laser beams that have passed through the microlens 221.

The condenser lens system 222 is appropriately selected according to the cross-sectional area of the laser beams that have passed through the microlens 221 and the core diameter and numerical aperture (NA) of the optical fiber 23. The condenser lens system 222 may include a plurality of optical elements.

The first condensing optical system 22 is satisfactory as long as it includes at least one condenser lens, and may include a plurality of optical elements.

The optical fiber 23 is disposed such that the laser beams exited from the first condensing optical system 22 is condensed at the center of the −Z side lateral edge face of the core. In the present embodiment, for example, an optical fiber where the core diameter is 1.5 mm is used as the optical fiber 23.

The laser beams incident on the optical fiber 23 propagate through the core, and exit from the +Z side lateral edge face of the core.

Due to the provision of the optical fiber 23, the surface emitting laser 21 may be disposed at a position distant from the laser resonator 25. Accordingly, the degree of flexibility in the arrangement of the surface-emitting laser 21 or the first condensing optical system 22 increases. Moreover, the surface-emitting laser 21 can be disposed at a position away from high-temperature regions around the engine 10. Accordingly, the engine 10 can be cooled using a variety of methods. Further, the surface-emitting laser 21 can be disposed at a position away from the engine 10 that is an oscillatory source. Accordingly, the deflection of the laser beams that are emitted from the surface-emitting laser 21 can be prevented.

The second condensing optical system 24 is disposed in the optical path of the laser beams emitted from the optical fiber 23, and concentrates the light emitted from the optical fiber 23. The laser beams that are concentrated by the second condensing optical system 24 enters the laser resonator 25. In the present embodiment, the second condensing optical system 24 includes, for example, a first lens 241 and a second lens 242.

The first lens 241 is a collimator lens that approximately collimates the laser beams emitted from the optical fiber 23.

The second lens 242 is a condenser lens that approximately concentrates the laser beams that are approximately collimated by the first lens 241.

The second condensing optical system 24 is satisfactory as long as it includes at least one condenser lens. The second condensing optical system 24 may consist of one optical element, or may include three or more lenses.

The laser resonator 25 is a Q-switched laser resonator. In the present embodiment, the laser resonator 25 includes a laser medium 251 and a saturable absorber 252. In the laser resonator 25, the energy density of the incident laser beams is increased, and the laser beams whose wavelengths are, for example, about 1064 nm are emitted with short pulse widths.

The laser medium 251 is an approximately cuboid-shaped neodymium (Nd): yttrium aluminum garnet (YAG) crystal, where 1.1 percent Nd is doped.

The saturable absorber 252 is an approximately cuboid-shaped chromium (Cr): YAG crystal. The optical transmittance of the saturable absorber 252 changes depending on the amount of absorption of laser beams, and the initial transmittance is about 0.50 (50%). When the amount of absorption of laser beams is small, the saturable absorber 252 serves as an absorber, and when the amount of absorption of laser beams is saturated, the saturable absorber 252 becomes transparent. As the saturable absorber 252 becomes transparent, Q-switch oscillation occurs.

The Nd: YAG crystal and the Cr: YAG crystal are both ceramic. The production cost of ceramics is lower than that of single crystal and inexpensive. In the present embodiment, the Nd: YAG crystal and the Cr: YAG crystal are bonded together to form a so-called composite crystal. Accordingly, the boundary between the Nd: YAG crystal and the Cr: YAG crystal is not detached, and the properties and characteristics equivalent to those of single crystal can be achieved in the laser resonator 25.

The surface of laser medium (incident plane) 251 on the incident side (−Z side) and the surface of the saturable absorber (exit plane) 252 on the light-exiting side (+Z side) are optically polished, and each of the surfaces serves as a mirror.

Further, dielectric layers are formed on the incident plane 251a and the exit plane 252b according to the wavelength of the light that is emitted from the surface-emitting laser 21 (e.g., 808 nm) and the wavelength of the laser beams that exit from the laser resonator 25 (e.g., 1064 nm). For example, a dielectric layer that indicates sufficiently high transmittance to the laser beams having a wavelength of 808 nm and indicates sufficiently high reflectance to the laser beams having a wavelength of 1064 nm are formed on the incident plane 251a. For example, a dielectric layer that indicates reflectance of about 50 percent to the laser beams having the wavelength of 1064 nm is formed on the exit plane 252b.

The laser beams that are concentrated by the second condensing optical system 24 enters the laser resonator 25. Then, the laser beams are resonated and amplified inside the laser resonator 25. Moreover, the laser medium 251 is optically pumped by the laser beams that are incident on the laser medium 251. Note that the wavelength of the laser beams that are emitted from the surface-emitting laser 21 (e.g., 808 nm in the present embodiment) is a wavelength where the absorption efficiency is the highest in the YAG crystal. The laser beams that are emitted from the surface-emitting laser 21, and then pass through the first condensing optical system 22 and the optical fiber 23 and become incident on the laser medium 251 may be referred to as pump light.

As the laser beams are resonated and amplified inside the laser resonator 25, the energy density of the laser beams is increased. When the amount of absorption of laser beams is saturated in the saturable absorber 252, Q-switch oscillation occurs in the saturable absorber 252. Accordingly, the laser beams of high energy density are emitted from the laser resonator 25 with a short pulse width and concentrated energy. The laser beams that are emitted from the laser resonator 25 may be referred to as a pulsed laser beam. The wavelength of such a pulsed laser beam is, for example, about 1064 nm.

The laser beams that are amplified by the laser resonator 25 are incident on the third condensing optical system 26.

The third condensing optical system 26 is disposed in the optical path of the laser beams that are emitted from the laser resonator 25. The third condensing optical system 26 concentrates the laser beams that are emitted from the laser resonator 25 to obtain a high energy density at a focal point. When the energy density of the concentrated laser beams exceeds a certain degree, the molecules that make up the gas included in the inflammable fuel-air mixture in the combustion chamber 14 are ionized, and are separated into positive ions and electrons. In other words, the molecules are broken down into plasma.

In the present embodiment, the third condensing optical system 26 consists of a third lens 261, a fourth lens 262, and a fifth lens 263.

The third lens 261 is an optical element that increases the divergence angle of the laser beams that are emitted from the laser resonator 25, and a concave lens is used as the third lens 261 in the present embodiment.

The fourth lens 262 is an optical element that collimates the light diverging from the third lens 261, and a collimator lens is used as the fourth lens 262 in the present embodiment.

The fifth lens 263 is an optical element that concentrates the laser beams emitted from the fourth lens 262, and a condenser lens is used as the fifth lens 263 in the present embodiment.

As the laser beams are concentrated by the fifth lens 263, a high energy density can be obtained at a focal point. When the energy density of the concentrated laser beams exceeds a certain degree, the molecules that make up the gas included in the inflammable fuel-air mixture in the combustion chamber 14 are ionized, and plasma is generated.

The third condensing optical system 26 can adjust the focal point of the light that is emitted from the laser device 11 in the Z-axis direction by adjusting the positions of the lenses of the third condensing optical system 26 in the optical-axis direction of the lenses or by changing the combination of the lenses of the third condensing optical system 26.

The third condensing optical system 26 according to the present embodiment consists of three lenses. However, third condensing optical system 26 is satisfactory as long as it includes at least one condenser lens, and may include only one optical element or a plurality of optical elements.

Next, the configuration of the window 27 according to the present embodiment is described.

Figure 3:
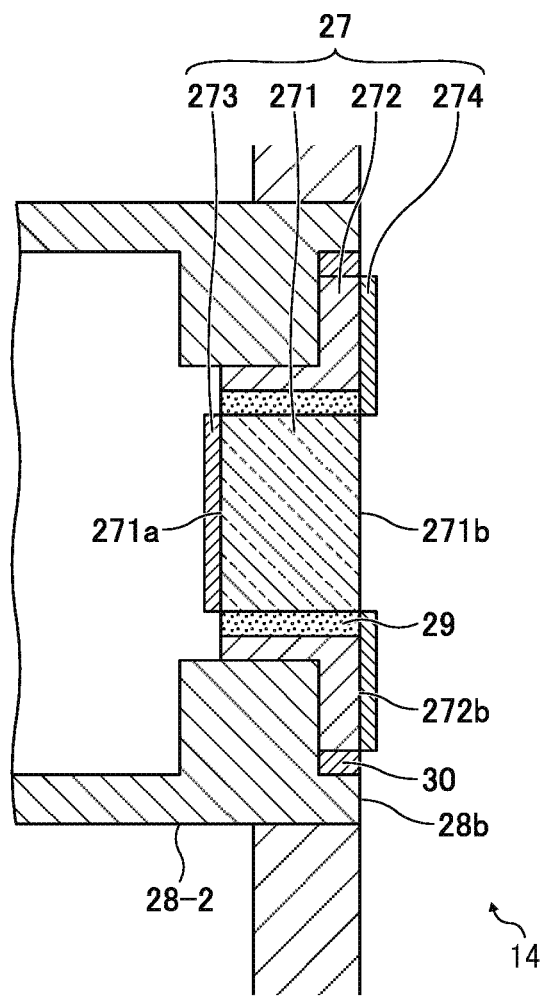
FIG. 3 is a sectional view of an example configuration of a window, according to an embodiment of the present disclosure.

FIG. 3 is a diagram illustrating an example configuration of the window 27, according to the present embodiment.

As illustrated in FIG. 3, the window 27 includes an optical window (main unit of window) 271, an optical window holding member 272, a dielectric layer 273, and a protective layer 274.

The optical window 271 is disposed in the optical path of the laser beams that are emitted from the third condensing optical system 26. The optical window 271 is made of a transparent or semitransparent material, and includes an incident plane 271a on which the laser beams are incident and an exit plane 271b from which the laser beams exit. The optical window 271 is fixed on the inside surfaces of the optical window holding member 272 as a joint, by a brazing member 29 that is formed by using a brazing material (binder). The optical window 271 is disposed at an opening that is formed on the surface of the housing 28 on the combustion chamber 14 side. The laser beams that are emitted from the third condensing optical system 26 pass through the optical window 271 and are concentrated inside the combustion chamber 14.

Note also that the shape of the optical window 271 in a planar view is not limited, and may be, for example, rectangular, circular, ellipsoidal, rectangular, or polygonal.

For example, an optical glass, a heat-resistant glass, a quartz glass, and a sapphire glass may be used as a material of the optical window 271. In particular, the optical window 271 needs sufficient pressure resistance to protect, for example, the optical elements inside the housing 28, from the firing pressure produced inside the combustion chamber 14. In order to achieve such sufficient pressure resistance, the thickness of the optical window 271 may be increased. However, if the thickness of the optical window 271 is increased, some of the laser beams that are incident on the exit plane of the optical window 271 tends to be reflected and concentrated inside the optical window 271. In order to prevent the concentration of light inside the optical window 271, the focal length of the third condensing optical system 26 needs to be extended.

When the focal length of the third condensing optical system 26 is extended, the numerical aperture (NA) of the lenses of the third condensing optical system 26 becomes small. Accordingly, the light-gathering power decreases, and the ignition quality decreases. For this reason, it is desired that the thickness of the optical window 271 be as thin as possible. In order to handle such a situation, it is desired that sapphire glass be used as the material of the optical window 271. The sapphire glass exhibits good durability under high-temperature and high-pressure environments.

The optical window holding member 272 is attached around the opening that is formed on the surface of the housing 28 on the combustion chamber 14 side, so as to cover the housing 28. The optical window holding member 272 is fixed to the housing 28 through a welded portion 30 that is formed, for example, by laser welding. In the present embodiment, the optical window holding member 272 is fixed to the housing 28 by welding such as laser welding. However, no limitation is indicated thereby, and the optical window holding member 272 may be fixed to the housing 28 by, for example, fastening screw, shrinkage fit, and adhesion.

The optical window 271 is fixed on the inside surfaces of the optical window holding member 272, by the brazing member 29. For example, the brazing material may be made of Au, Ag, Cu, Pd, Al, Mg, Pt, P, Ti, W, Sn, Ni, Zn, Si, B, Cd, Li, Mn, Cr, or Zr. Alternatively, the brazing material may be made of stainless steel. These materials may be used independently or in combination. Alternatively, one of the above materials may be adopted as the main ingredient, and a different additive may be mixed to the main ingredient.

For example, a heat-resistant metallic material such as iron (Fe), nickel (Ni), Ni—Fe alloy, Ni—Cr—Fe alloy, Ni—Co—Fe alloy, and stainless steel may be used as a material that forms the optical window holding member 272. The Ni—Cr—Fe alloy may be, for example, Inconel, and the Ni—Co—Fe alloy may be, for example, Kovar.

An exit-side end surface 272b of the optical window holding member 272 and an end face 28b of a second housing 28-2 are approximately on the same geometric plane. Due to this configuration, when the welded portion 30 is formed, for example, by laser welding, it is easy to concentrate the laser beams onto the welded portion 30. As a result, the welded portion 30 can evenly be disposed between the optical window holding member 272 and the second housing 28-2, with high stability and reliability. Accordingly, the optical window holding member 272 can be fixed onto the second housing 28-2 with high stability.

The dielectric layer 273 is arranged on the surface of the optical window 271 on the third condensing optical system 26 side, i.e., the incident plane 271a of the window 27 on which the laser beams are incident. The dielectric layer 273 serves as an antireflection (AR) film. The dielectric layer 273 has a high optical transmittance for the laser beams with wavelengths of 1064 nm.

The dielectric layer 273 may be made of, for example, a material whose main component is one of silicon (Si), sodium (Na), aluminum (Al), calcium (Ca), magnesium (Mg), boron (B), carbon (C), titanium (Ti), vanadium (V), chromium (Cr), manganese (Mn), iron (Fe), cobalt (Co), nickel (Ni), copper (Cu), zinc (Zn), gallium (Ga), strontium (Sr), zirconium (Zr), niobium (Nb), ruthenium (Ru), palladium (Pd), silver (Ag), indium (In), tin (Sn), hafnium (Hf), tantalum (Ta), tungsten (W), osmium (Os), gold (Au), and bismuth (Bi), or a material that includes at least one of a nitride, oxide, carbide, and a fluoride of the above main component.

In particular, for example, magnesium fluoride ($MgF_2$), silicon nitride ($Si_3N_4$), and silicon dioxide ($SiO_2$) may be used. The less difference in refractive index between the dielectric layer 273 and the optical window 271, the more the antireflective properties and characteristics improve.

The thickness of the dielectric layer 273 is not limited to any particular value as long as it has a high optical transmittance for the laser beams with wavelengths of 1064 nm. For example, when the optical window 271 is made from sapphire glass, the refractive index of the sapphire is about 1.74. Accordingly, it is desired that the thickness of the dielectric layer 273 be about 202 nm and the refractive index of the dielectric layer 273 be about 1.32.

The dielectric layer 273 may be formed on the surface of the optical window 271 on the third condensing optical system 26 side, for example, after the optical window 271 is fixed on the inside surfaces of the optical window holding member 272 by brazing. As a method of forming the dielectric layer 273 on the optical window 271, for example, vapor deposition, sputtering, thermal spraying (flame plating), coating, or sol-gel processes may be used.

The dielectric layer 273 can prevent the reflection light caused within the optical window 271 from affecting an optical element that is coaxial to the surface-emitting laser 21, as return light. Accordingly, the intensity of the laser beams can be prevented from fluctuating.

In the present embodiment, the dielectric layer 273 has single-layer structure. However, no limitation is intended thereby, and the dielectric layer 273 may have multilayer structure.

The protective layer 274 is disposed on the faces of the optical window holding member 272 and the brazing member 29 on the combustion chamber 14 side, i.e., the face of the window 27 from which the laser beams exit.

The materials of the protective layer 274 may be, for example: metal such as Ni, Au, Pt, Ti, Ag, Cu, Al, Pd, Rh, W, Mo, Zr, Ta, Nb, and Ir; metallic oxide such as $SiO_2$, $Si_3N_4$, and $Al_2O_3$; and carbon material such as ketjen black, acetylene black, carbon black, graphite, and carbon nanotube. These materials may be used independently or in combination. Among the above materials, it is desired that Ni be adopted. This is because Ni has high resistance to oxidation. Alternatively, Au, Pt, or Ti may be adopted. This is because Au, Pt, and Ti have high resistance to oxidation and high protection against corrosion.

After the optical window 271 is fixed onto the inside surfaces of the optical window holding member 272 by the brazing member 29, the protective layer 274 is formed onto the faces of the optical window holding member 272 and the brazing member 29 on the combustion chamber 14 side. In order to form the protective layer 274 onto the optical window holding member 272 and the brazing member 29, for example, electroplating, sol-gel process, vapor deposition, sputtering, thermal spraying (flame plating), coating may be used. Among the above methods, it is desired that the electroplating be adopted in order to form the protective layer 274 onto the optical window holding member 272 and the brazing member 29 in a stable manner, without affecting the optical window 271. Ni is suitable for the material of the protective layer because Ni has high resistance to oxidation and high protection against corrosion. Moreover, electrolytic plating can be done using Ni.

The protective layer 274 is disposed onto the optical window holding member 272 and the brazing member 29 in order to prevent the oxidization on the brazing member 29. For this reason, during the combustion in the internal combustion engine, even if the temperature in the combustion chamber 14 increases to several hundred degrees Celsius (° C.) (momentarily, even if the temperature in the combustion chamber 14 increases to several thousand degrees Celsius (° C.)), the oxidization and deterioration of the face of the brazing member 29 can be prevented. Due to this configuration, the face of the brazing member 29 can be prevented from being cracked, or the loss of some of the brazing member 29 can be prevented. Accordingly, the optical window 271 can be fixed to the optical window holding member 272 with high stability on a long-term basis.

As long as the protective layer 274 can stably coat the brazing member 29 and the protective layer 274 does not prevent the passage of the laser beams exited through the optical window 271, the average thickness of the protective layer 274 is not limited to any specific range of values. It is desired that the average thickness of the protective layer 274 have at least several micrometers (μm), in order for the protective layer 274 to stably coat the brazing member 29.

As illustrated in FIG. 3, in the present embodiment, the exit plane 271*b* of the optical window 271 on the incident side and the exit-side end surface 272*b* of the optical window holding member 272 are approximately on the same geometric plane. Due to this configuration, the protective layer 274 where the variations in thickness are small can be formed with stability on the brazing member 29 and the optical window holding member 272.

In regard to the relative position between the exit plane 271*b* of the optical window 271 and the exit-side end surface 272*b* of the optical window holding member 272, for example, there are some cases in which the exit plane 271*b* of the optical window 271 is recessed towards the light incident side with reference to the exit-side end surface 272*b* of the optical window holding member 272. In this configuration, when, for example, electrolytic plating is adopted and the protective layer 274 is disposed onto the optical window holding member 272 and the brazing member 29, an electric current tends to concentrate around the edges of the brazing member 29, and the edges of the brazing member 29 tend to be the center of abnormal precipitation. For this reason, the protective layer 274 may be formed in a protruding manner around the edges of the brazing member 29. If there are some spots where abnormal precipitation tends to occur when the protective layer 274 is formed, the accuracy of the protective layer 274 may decrease. Further, if such a protruding portion on the protective layer 274 is irradiated with laser beams, the laser beams are reflected, and the output of the laser beams may decrease.

In order to avoid such a situation, in the present embodiment, the exit plane 271*b* of the optical window 271 on the light exiting side and the exit-side end surface 272*b* of the optical window holding member 272 are approximately on the same geometric plane, and the protective layer 274 where the variations in thickness are small is formed on the brazing member 29 and the optical window holding member 272. When, for example, electrolytic plating is adopted and the protective layer 274 is disposed onto the optical window holding member 272 and the brazing member 29, the protective layer 274 can have high accuracy. Moreover, the laser beams that are exited through the optical window 271 can be prevented from being reflected by the protective layer 274. Accordingly, a reduction in the output of the laser beams that are emitted from the third condensing optical system 26 can be controlled.

As illustrated in FIG. 2, the housing 28 accommodates the second condensing optical system 24, the laser resonator 25, the third condensing optical system 26, and the window 27A. In the present embodiment, the housing 28 consists of the first housing 28-1 and the second housing 28-2. The first housing 28-1 accommodates the second condensing optical system 24 and the laser resonator 25, and The second housing 28-2 accommodates the third condensing optical system 26 and the window 27A.

The housing 28 is made of, for example, a heat-resistant metallic material such as iron (Fe), Ni—Fe alloy, Ni—Cr—Fe alloy, Ni—Co—Fe alloy, and stainless steel. The Ni—Cr—Fe alloy may be, for example, Inconel, and the Ni—Co—Fe alloy may be, for example, Kovar.

As described above, the laser device 11 according to the present embodiment has the protective layer 274 on the faces of the optical window holding member 272 and the brazing member 29 on the combustion chamber 14 side. Due to this configuration, the brazing member 29 can be prevented from degrading. Accordingly, the optical window 271 can be fixed to the optical window holding member 272 with high stability. For this reason, the optical window 271 can be prevented from dropping off, and thus the laser device 11 according to the present embodiment can be used with high stability on a long-term basis. In other words, a highly-reliable laser device can be achieved. In the present embodiment, a laser device is described by way of example. However, no limitation is intended thereby. Even if different kinds of laser devices are used, due to the existence of a protective layer, the joint can be protected from the effect of the environments where the laser device is used, and thus a highly-reliable laser device can be achieved.

As the engine 10 is provided with the laser device 11 according to the present embodiment, stable combustion can be achieved. Accordingly, the engine 10 can be used with high stability on a continual basis.

In the present embodiment, the protective layer 274 is disposed on the faces of the optical window holding member 272 and the brazing member 29 on the combustion chamber 14 side. However, the protective layer 274 may be disposed only on the face of the brazing member 29 on the combustion chamber 14 side. Alternatively, the protective layer 274 may be disposed on the face of the housing 28 on the combustion chamber 14 side in addition to the faces of the optical window holding member 272 and the brazing member 29 on the combustion chamber 14 side.

In the present embodiment, the brazing member 29 that is formed by using a brazing material, which serves as a bond, is used as a joint. However, no limitation is intended thereby. The joint is satisfactory as long as it is formed by a material that can join the optical window 271 and the optical window holding member 272 together under the environments where the laser device is used.

Figure 4:
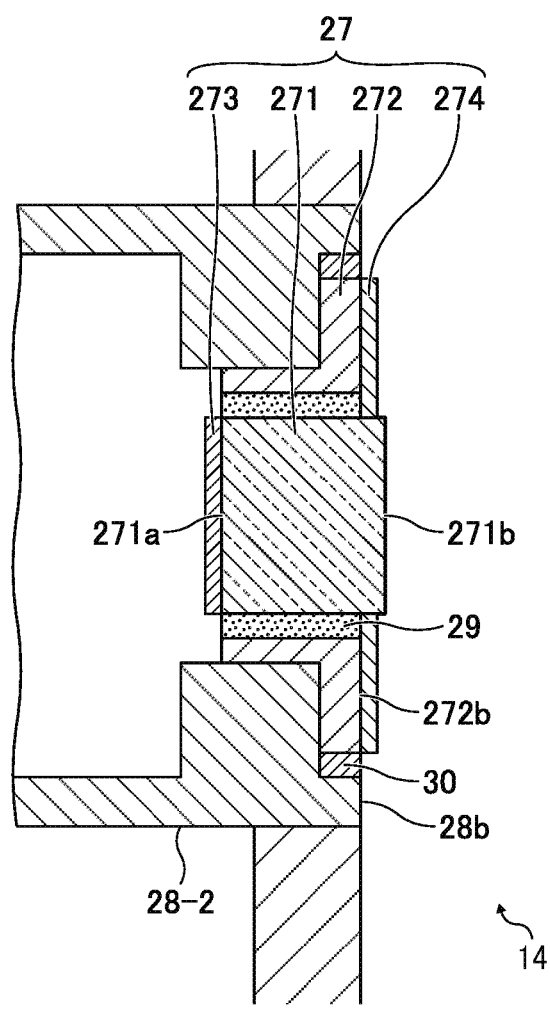
FIG. 4 is a sectional view of another configuration of a window, according to an embodiment of the present disclosure.

As illustrated in FIG. 3, in the present embodiment, the exit plane 271b of the optical window 271 and the exit-side end surface 272b of the optical window holding member 272 are approximately on the same geometric plane. However, no limitation is intended thereby. For example, as illustrated in FIG. 4, the exit plane 271b of the optical window 271 may protrude to the combustion chamber 14 side, which is on the light exiting side with reference to the exit-side end surface 272b of the optical window holding member 272. Also in such a configuration as above, when, for example, electrolytic plating is adopted and the protective layer 274 is disposed onto the optical window holding member 272 and the brazing member 29, there is no edge where an electric current tends to concentrate. Due to this configuration, the protective layer 274 where the variations in thickness are small can be formed with stability on the brazing member 29 and the optical window holding member 272. When, for example, electrolytic plating is adopted and the protective layer 274 is disposed onto the optical window holding member 272 and the brazing member 29, no abnormal precipitation of the protective layer 274 is expected at any site. Accordingly, the protective layer 274 can have high accuracy. Further, the laser beams that are exited through the optical window 271 can be prevented from being reflected by the protective layer 274, and thus a reduction in the output of the laser beams can be controlled.

In the present embodiment, the housing 28 accommodates the second condensing optical system 24, the laser resonator 25, the third condensing optical system 26, and the optical window 271. However, the housing 28 may further accommodate the first condensing optical system 22 and the optical fiber 23.

In the present embodiment, the first housing 28-1 accommodates the second condensing optical system 24 and the laser resonator 25, and the second housing 28-2 accommodates the third condensing optical system 26 and the window 27. However, no limitation is intended thereby. For example, the first housing 28-1 may accommodate only the second condensing optical system 24, and the second housing 28-2 may further accommodate the laser resonator 25. Alternatively, the first housing 28-1 may further accommodate the third condensing optical system 26 in addition to the second condensing optical system 24 and the laser resonator 25, and the second housing 28-2 may accommodate only the window 27.

In the present embodiment as described above, cases in which the surface-emitting laser 21 is used as a pump source are described. However, no limitation is intended thereby, and other kinds of light source may be used.

When it is not necessary to arrange the surface-emitting laser 21 at a position distant from the laser resonator 25 in the present embodiment, the provision of the optical fiber 23 may be omitted.

In the present embodiment, the dielectric layer 273 is arranged on the surface of the optical window 271 on the third condensing optical system 26 side, i.e., the incident plane 271a of the window 27 on which the laser beams are incident. However, no limitation is indicated thereby, and when no disadvantage expected by the reflected light or the like, the dielectric layer 273 may be omitted.

In the present embodiment, cases in which the laser device 11 is used as an ignition system for the engine 10 that serves as the internal combustion engine and moves upward and downward a piston with flammable gas are described. However, no limitation is intended thereby. The laser device 11 may be used for an engine that burns fuel to produce flammable gas. For example, the laser device 11 may be used for a rotary engine, a gas turbine engine, and a jet engine. Moreover, the laser device 11 may be used for cogeneration that is a system in which exhaust heat is reused to increase the comprehensive energy efficiency. The exhaust heat in cogeneration is used for obtaining motive power, heating energy, or cooling energy. Furthermore, the laser device 11 may be used for, for example, image forming apparatuses such as a laser copier and a laser printer, image projection devices such as a projector, laser beam machines, laser peening devices, or terahertz (THz) generators.

Numerous additional modifications and variations are possible in light of the above teachings. It is therefore to be understood that within the scope of the appended claims, the disclosure of the present invention may be practiced otherwise than as specifically described herein. For example, elements and/or features of different illustrative embodiments may be combined with each other and/or substituted for each other within the scope of this disclosure and appended claims.

What is claimed is:

1. A laser device, comprising:
   a light source configured to emit light;
   an optical system configured to concentrate the light emitted from the light source;
   a housing configured to accommodate the optical system; and
   a window disposed to the housing, to which the light passed through the optical system is incident, wherein the window includes
      an optical window having an exit plane through which the light exits from the optical system, and having a side surface,
      an optical window holding member configured to hold the optical window,
      a joint between the side surface of the optical window and the optical window holding member to join the optical window to the optical window holding member, and
      a protective layer disposed on a surface of the joint, on a side where the light is emitted from the window, wherein the protective layer is a coating.

2. The laser device according to claim 1, wherein the protective layer is one of (1) disposed on a face of the optical window holding member, and (2) disposed on a face of the optical window holding member and the housing.

3. The laser device according to claim 1, wherein the protective layer includes at least one of Ni, Au, Pt, Ti, Ag, Cu, Al, Pd, Rh, W, Mo, Zr, Ta, Nb, Ir, $SiO_2$, $Si_3N_4$, $Al_2O_3$, and a carbon material.

4. The laser device according to claim 1, wherein the exit plane of the optical window is one of (1) on a same plane as an exit-side end surface of the optical window holding member, and (2) protrudes in a light exit direction of the light with reference to the exit-side end surface.

5. The laser device according to claim 1, wherein an exit-side end surface of the optical window holding member is on a same plane as an end surface of the housing.

6. The laser device according to claim 1, wherein the joint is made of a brazing material.

7. An internal combustion engine comprising:
   the laser device according to claim 1; and
   a combustion chamber configured to burn fuel to produce inflammable gas,
   wherein the fuel is ignited by the laser device.

* * * * *